United States Patent [19]
Lo

[11] Patent Number: 5,375,089
[45] Date of Patent: Dec. 20, 1994

[54] PLURAL PORT MEMORY SYSTEM UTILIZING A MEMORY HAVING A READ PORT AND A WRITE PORT

[75] Inventor: William Lo, Santa Clara, Calif.

[73] Assignee: Advanced Micro Devices, Inc., Sunnyvale, Calif.

[21] Appl. No.: 132,027

[22] Filed: Oct. 5, 1993

[51] Int. Cl.[5] .......................... G11C 7/00; G11C 8/00
[52] U.S. Cl. .................. 365/189.04; 365/189.03; 365/189.05; 365/230.02; 365/230.05; 365/230.08
[58] Field of Search ...................... 365/189.04, 230.02, 365/230.05, 230.08, 189.05, 189.03

[56] References Cited

U.S. PATENT DOCUMENTS

| | | | |
|---|---|---|---|
| 4,967,398 | 10/1990 | Jamoua et al. | 365/189.04 |
| 5,036,491 | 7/1991 | Yamaguchi | 365/230.05 |
| 5,276,842 | 1/1994 | Sugita | 365/230.05 |

Primary Examiner—Eugene R. LaRoche
Assistant Examiner—Tan Nguyen
Attorney, Agent, or Firm—Benman Collins & Sawyer

[57] ABSTRACT

A plural port memory system utilizing a memory having a write port and a separate read port wherein the write port includes a write data line, a write address, and a write enable line and wherein the read port includes a read data line, a read address, and a read enable line. The plural port memory system includes: a plurality of interfaces for reading from and writing to the memory, each interface having a read request line and a write request line; and a controller coupled to each of the read and write request lines, and the read and write enable lines for arbitrating access to the memory by the plurality of interfaces.

16 Claims, 4 Drawing Sheets

PLURAL PORT MEMORY SYSTEM UTILIZING A MEMORY HAVING A READ PORT AND A WRITE PORT

BACKGROUND OF THE INVENTION

1. Field of the Invention

This invention relates generally to a digital memory and more particularly to memories accessible by more than one port.

2. Description of the Related Art

Digital memory is commonly used in computer data processing systems to store data and programs. Digital memory is also used for storing data in many special purpose digital applications. Access to a digital memory is through ports on the memory. The arrangement and the design of the memory ports determine how the memory can be used.

A conventional single port static random access memory (RAM) can only be read from or written to during a memory cycle. What is meant by a memory cycle in the context of the memory application herein, is the minimum time required to complete a transaction, such as read or write, before another transaction can occur. For a conventional single port static RAM all access is through the single port, so only a read or write of the memory can occur on a memory cycle. A disadvantage of this type of static RAM cell is that a precharge is required on the read port prior to reading the cell. Accordingly, the read access time is slowed significantly.

Conventional static RAMs do exist that have a read port and a separate write port. In these static RAMs it is possible to write to the static RAM on the write port while reading from the static RAM on the read port; however, it is not possible to perform two writes or two reads in one cycle. These types of static RAM cells normally require 9 complementary metal-oxide semiconductor (CMOS) transistors and are more complex than single port static RAMs, which typically require 6 CMOS transistors. An advantage of this configuration is that the read port does not need to be precharged.

Another type of conventional static RAM is a dual port static RAM, which has two read/write ports. A typical dual port static RAM can have 8 transistors, On each of the two ports the static RAM memory cell can be read or written on each memory cycle. The possible port1/port2 operation combinations on each memory cycle for a static memory cell are: read/read, read/write, and write/read. A write/write combination on both ports into one static memory cell on the same cycle will cause problems, especially if values of the opposite polarity are written, because the cell can only store one state (high or low) at a time. However, typically a memory is implemented with many cells and it is possible to write via the two ports simultaneously to two different static memory cells. A disadvantage of this type of static RAM cell is that precharging is required on the read ports. This slows down the read access times for both ports. This cell is larger than the previous mentioned cell because there is an additional routing line even though there are fewer transistors.

It is also possible to construct a static memory cell with 2 separate read ports and 2 separate write ports. This type of static RAM cell becomes quite complex, because it typically requires 12 transistors per cell plus additional routing lines. The same write/write limitations of the dual port static RAM apply to this type of static RAM. An advantage of this configuration is that the read ports do not need to be precharged.

A dual port static RAM has advantages over a single port static RAM, because a dual port static RAM allows access to the static RAM by two users of the static RAM; however, a dual port static RAM requires more transistors per static memory cell. The result since routing takes more space is that on a given area of silicon, fewer dual port static memory cells can be placed, which results in less memory density. Single port static RAMs have fewer transistors per static memory cell and correspondingly less routing, greater density, and cost less per bit of memory than memories with more ports; however, a single port static RAM is limited to access by one user per memory cycle and requires precharging prior to a read operation. The static RAM cell with dual read ports and dual write ports does not require precharging the read ports and allows two users to access the memory simultaneously; however, this static RAM cell is too complex and costly. The static RAM cell with a single read port and a separate single write port does not require precharging the single read port and is also smaller due to less routing; however, the single read port can only be used to read the memory and the single write port can only be used to write into the memory, which does not allow two interfaces the ability to both read and write into the memory.

Accordingly, there is a need in the art for a dense and low cost memory system that provides multiple interfaces to the memory that are each able to read from and write to the memory.

SUMMARY OF THE INVENTION

The need in the art is addressed by a plural port memory system utilizing a memory having a write port and a separate read port wherein the write port includes a write data line, a write address, and a write enable line and wherein the read port includes a read data line, a read address, and a read enable line. The present invention includes a plurality of interfaces for reading from and writing to the memory, each interface having a read request line and a write request line. A controller is coupled to each of the read and write request lines, and the read and write enable lines for arbitrating access to the memory by the plurality of interfaces. If at least two read requests are simultaneously received by the controller during a first cycle of the memory, the controller activates the read enable to the memory and selectively couples a first one of the interfaces to the read port during the first cycle of the memory. On a second cycle of the memory the controller decouples the first one of the interfaces, activates the read enable and selectively couples a second one of the interfaces to the read port. If at least two write requests are simultaneously received by the controller during a first cycle of the memory, the controller activates the write enable to the memory and selectively couples the first one of the interfaces to the write port during the fourth cycle of the memory. On a fourth cycle of the memory the controller decouples the first one of the interfaces, activates the write enable and selectively couples the second one of the interfaces to the write port.

In a specific embodiment each interface has successive read requests separated by at least one cycle of the memory.

In another specific embodiment each interface has successive write requests separated by at least one cycle of the memory.

In an alternate specific embodiment a dual port memory system utilizes a memory having a read port and a separate write port wherein the read port includes a read data line, a read address, and a read enable line and wherein the write port includes a write data line, a write address, and a write enable line. The dual port memory system includes a first interface for reading from and writing to the memory having a first read request line and a first write request line and a second interface means for reading from and writing to the memory having a second read request line and a second write request line. A controller is coupled to the first and second read request lines, the first and second write request lines, and the read and write enable lines for arbitrating access to the memory by the first and second interface means. If the first and second read requests are simultaneously received by the controller during a first cycle of the memory, the controller activates the read enable to the memory and selectively couples the first interface means to the read port during the first cycle of the memory. On a second cycle of the memory the controller decouples the first interface means, activates the read enable and selectively couples the second interface means to the read port. If the first and second write requests are simultaneously received by the controller during a first cycle of the memory, the controller activates the write enable to the memory and selectively couples the first interface to the write port during the first cycle of the memory. On a second cycle of the memory the controller decouples the first interface, activates the write enable and selectively couples the second interface to the write port.

In a specific embodiment the first interface has successive read requests separated by at least one cycle of the memory and the second interface has successive read requests separated by at least one cycle of the memory.

In another specific embodiment the first interface means has successive write requests separated by at least one cycle of the memory and the second interface means has successive write requests separated by at least one cycle of the memory.

The plural port memory system provides a dense and low cost memory system that provides multiple interfaces to the memory that are each able to read and write the memory. The plural port memory system also provides for arbitrating between the plural ports for access to the memory.

DESCRIPTION OF THE INVENTION

The present invention relates to an improvement in dual port memory system. The following description is presented to enable one of ordinary skill in the art to make and use the invention as provided in the context of a particular application and its requirements. Various modifications to the preferred embodiments will be readily apparent to those skilled in the art, and the generic principles defined here may be applied to other embodiments. Thus, the present invention is not intended to be limited to the embodiments shown, but is to be accorded the widest scope consistent with the principles and novel features disclosed herein.

Figure 1:
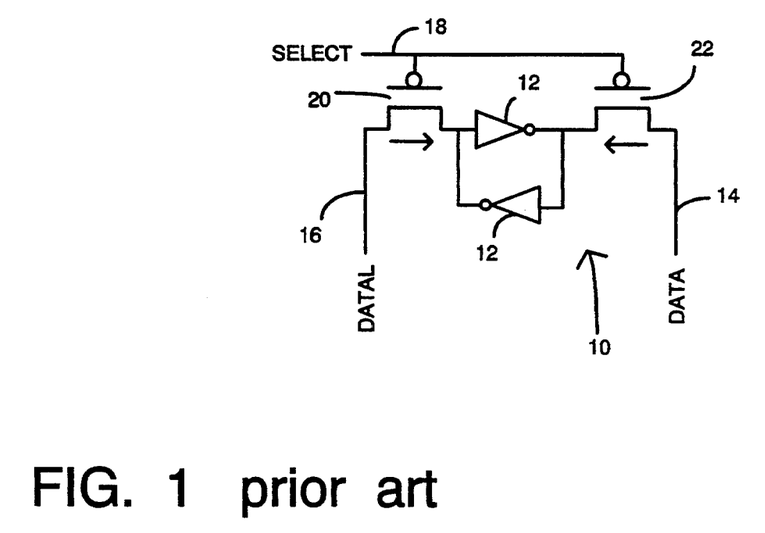
FIG. 1 is an illustrative diagram of a conventional single port static memory cell.

FIG. 1 is an illustrative diagram of a conventional single port random access static memory cell. The static memory cell 10 is implemented with two inverters 12. Each inverter has two transistors. The static memory cell 10 is read and written via the data line 14 and the data low line 16. A particular static memory cell out of an array of static memory cells is selected by the select line 18, which is active when low. The select line 18 enables the transistor 20 and the transistor 22. This conventional single port random access memory static (RAM) can only be read or written during a memory cycle, because all access is through the single port provided by the data line 14 and the data low line 16. There are 6 CMOS transistors required for each static memory cell.

Figure 2:
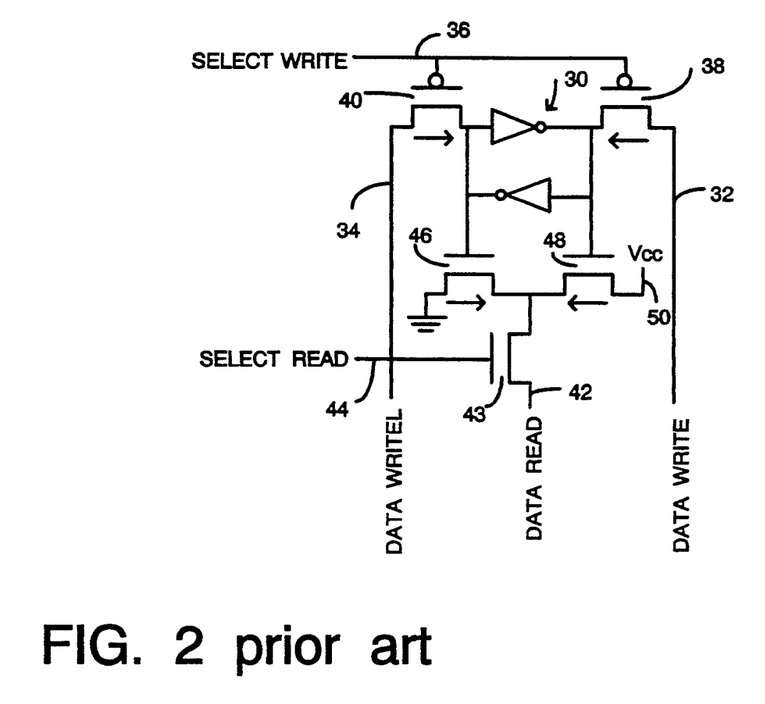
FIG. 2 is an illustrative diagram of a conventional static memory cell having a single read port and a single write port.

FIG. 2 is an illustrative diagram of a conventional static memory cell having a single read port and a single write port. The static memory cell 30 is again implemented by two inverters. The data write line 32 and the data write low line 34 are used only to write data into the static memory cell 30. The select write line 36 is used to select the static memory cell from an array of static memory cells (not shown) for a write operation and enables the transistor 38 and the transistor 40. The data read line 42 is used to read data from the static memory cell. A select read line 44 is used to select a read operation on a particular static memory cell from an array of static memory cells and enables the transistor 43. The transistor 46, which is coupled to ground and the transistor 48, which is coupled to the $V_{cc}$ power input 50, provide circuitry for statically driving the data read line 42. It is possible to write the static memory cell via the write port while reading the static RAM via the read port, because the data write lines 32 and 34 are separate from the data read line 42; however, it is not possible to perform two writes or two reads in one cycle, because only one data write line and one data read line are provided. However, a major disadvantage of this configuration is that these static memory cells are more complex than single port static RAMs and require 9 CMOS transistors per static memory cell, an extra address decode line and extra read line. An advantage over single port static RAMs of this configuration is that read/writes can occur concurrently and there is no need to precharge the read line.

Figure 3:
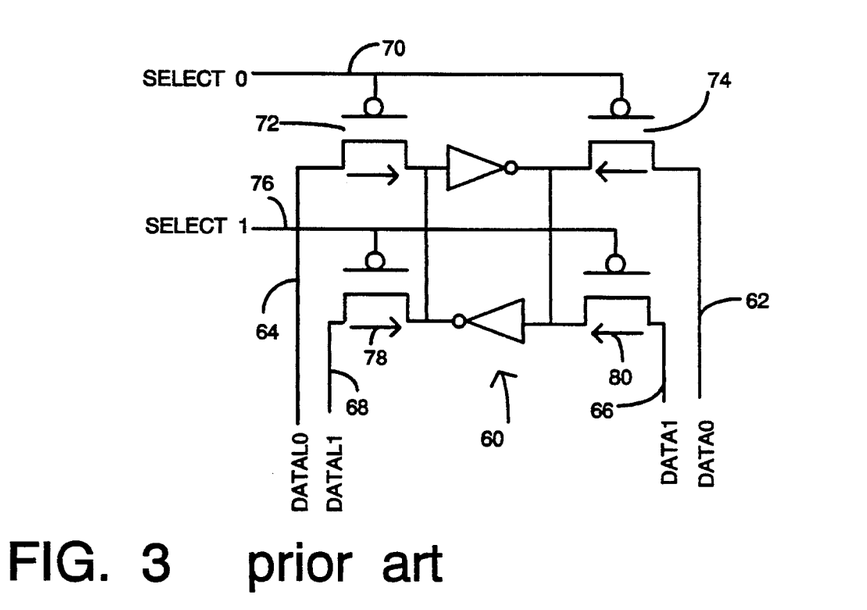
FIG. 3 is an illustrative diagram of a conventional dual port static memory cell.

FIG. 3 is an illustrative diagram of a conventional dual port static memory cell. The static memory cell 60 can be read or written via the first port implemented by the data 0 line 62 and the data 0 low line 64, or via the second port implemented by the data 1 line 66 and the data 1 line low 68. The select 0 line 70 selects the static memory cell from an array of static memory cells for either a read or a write by the data 0 line 62 and the data 0 low line 64 by gating the transistor 72 and the transistor 74. Similarly, the select 1 line 76 selects the static memory cell from an array of static memory cells for either a read or a write by the data 1 line 66 and the data 1 line low 68 by gating the transistor 78 and the transistor 80. The dual port static RAM has 8 transistors and has two read/write ports. On each of the two ports the static RAM static memory cell can be read or written on each memory cycle. The possible first port/second port combinations on each memory cycle for a static memory cell are: read/read, read/write, and write/­read. A write/write combination on both ports into one static memory cell on the same cycle will cause problems, especially if values of the opposite polarity are written, because the cell can only store one state (high or low) at a time. However, typically a memory is implemented with many cells and it is possible to write via the two ports simultaneously to two different static memory cells. A disadvantage of this type of static RAM cell is that precharge to the read port is required. The static RAM cell of FIG. 3 is larger than that of FIG. 2 because of the extra line.

Figure 4:
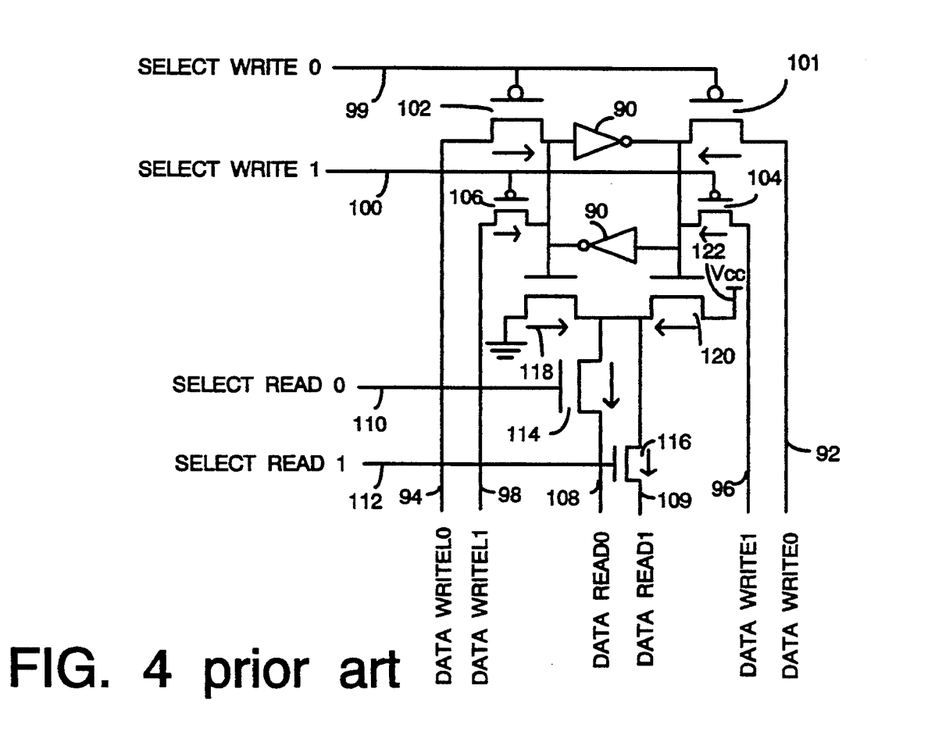
FIG. 4 is an illustrative diagram of a conventional static memory cell having dual read ports and dual write ports.

FIG. 4 is an illustrative diagram of a conventional static memory cell having dual read ports and dual write ports. The static memory cell is implemented by the two inverters 90. Data can be written via a first write port implemented by the data write 0 line 92 and the data write 0 low line 94, which is selected to write into the static memory cell by the select write 0 line 99 that enables the transistor 101 and the transistor 102. Data can also be written via a second write port implemented by the data write 1 line 96 and the data write 1 low line 98, which is selected to write into the static memory cell by the select write 1 line 100 that enables the transistor 104 and the transistor 106. Data can be read via the data read port 0 108, which is selected by the select read 0 line 110, which enables the transistor 114. Data can also be read via the data read port 1 109, which is selected by the select read 1 line 112, which enables the transistor 116. The read ports are statically driven by the transistor 118 and the transistor 120, which are coupled to ground and the $V_{cc}$ power input 122, respectively. This static memory cell requires 12 transistors per cell. The same write/write limitations of the dual port static RAM apply to this type of static RAM.

In summary the conventional art does not include a dense and low cost memory system that also provides multiple interfaces to the memory that are each able to read and write the memory. The static memory cell of FIG. 4 provides dual read ports and dual write ports; however, this static memory cell has low density, because each static memory cell requires 12 transistors and also requires a number of extra routing lines. The static memory cell of FIG. 2 is less complex than that of FIG. 4; however, this static memory cell does not provide multiple interfaces to the memory that are each able to read and write the memory. The static memory cells of FIGS. 1 and 3 require the precharging of the data lines during a read operation.

Figure 5:
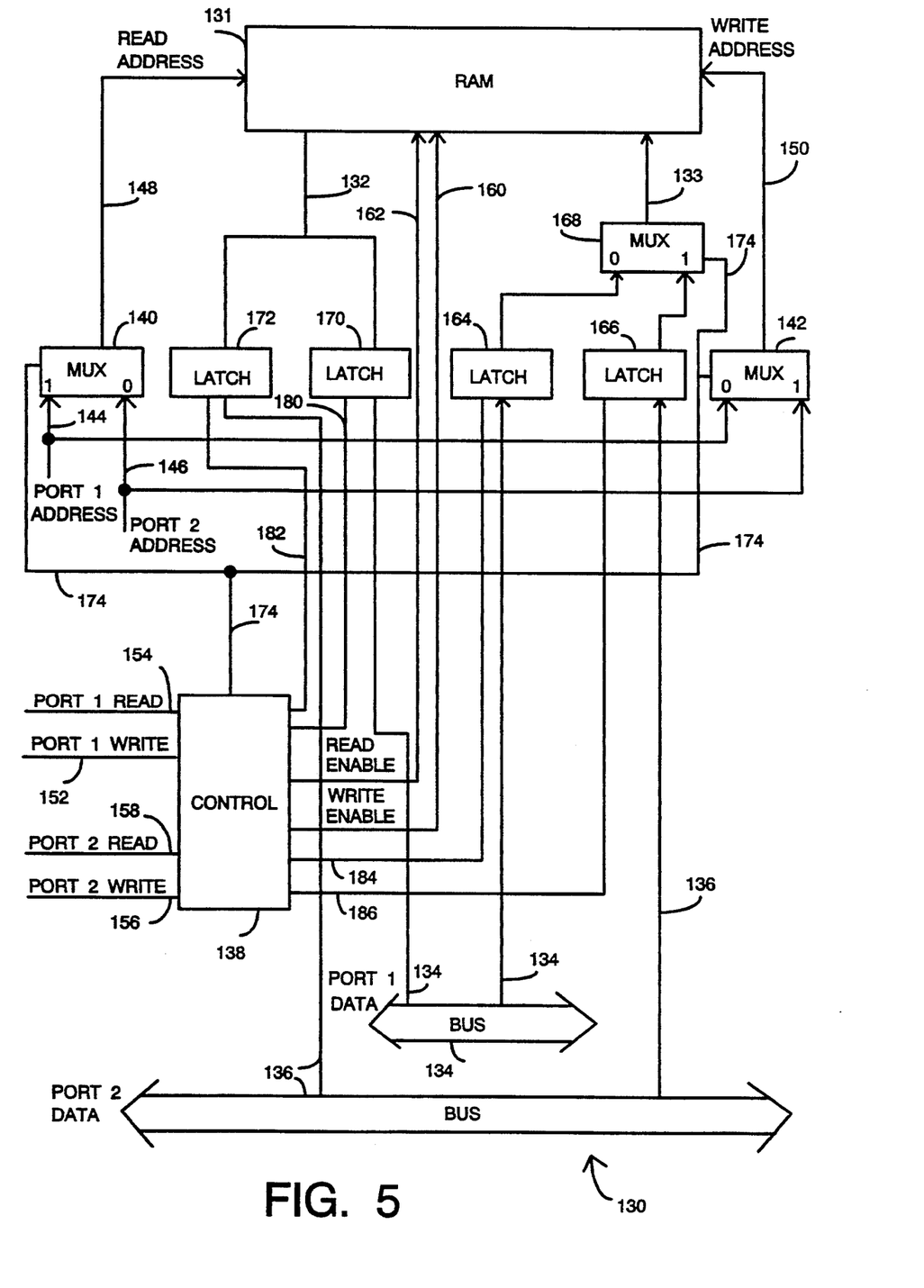
FIG. 5 is an illustrative diagram of a dual port memory utilizing a memory having a single read port and a single write port according to the present invention.

FIG. 5 is an illustrative diagram of a low cost dual port memory 130 of the present invention that is denser than prior art cells and do not require precharging during a read operation and also provides multiple interfaces to the memory that are each able to read and write the memory. The present invention also provides for arbitrating between the multiple interfaces for access to the memory.

The dual port memory has a random access memory 131 that is implemented with multiple static memory cells of the type illustrated in FIG. 2 and described above. The static memory cells of FIG. 2 have a single read port and a single write port. The random access memory 131 has a read port coupled to read data lines 132, a write port coupled to write data line 133, a read address 148, a write address 150, a write enable 160, and a read enable 162. These interfaces to the random access memory 131 generally correspond to the interfaces shown in FIG. 2 except that the enables and address lines combine to form individual read enables and write enables to each cell.

The dual port memory 130 has two ports, a port 1 and a port 2. The port 1 interface includes the port 1 data interface line 134, the port 1 interface address 144, the port 1 write request 152, and the port 1 read request 154. Similarly, the port 2 interface includes the port 2 data interface line 136, the port 2 interface address 146, the port 2 write request 156, and the port 2 read request 158. The port 1 data interface line 134 is connected to the latch 164 and the latch 170. The port 2 data interface line 136 is connected to the latch 166 and the latch 172. The latch 164 and the latch 166 are connected to the multiplexer 168, which in turn is connected to the write data line 133. The latch 170 and the latch 172 are connected to the read data line 132.

The port 1 interface address 144 and the port 2 interface address 146 are connected to the multiplexer 140, which outputs the read address 148. Similarly, the port 1 interface address 144 and the port 2 interface address 146 are connected to the multiplexer 142, which outputs the write address 150.

Figure 6:
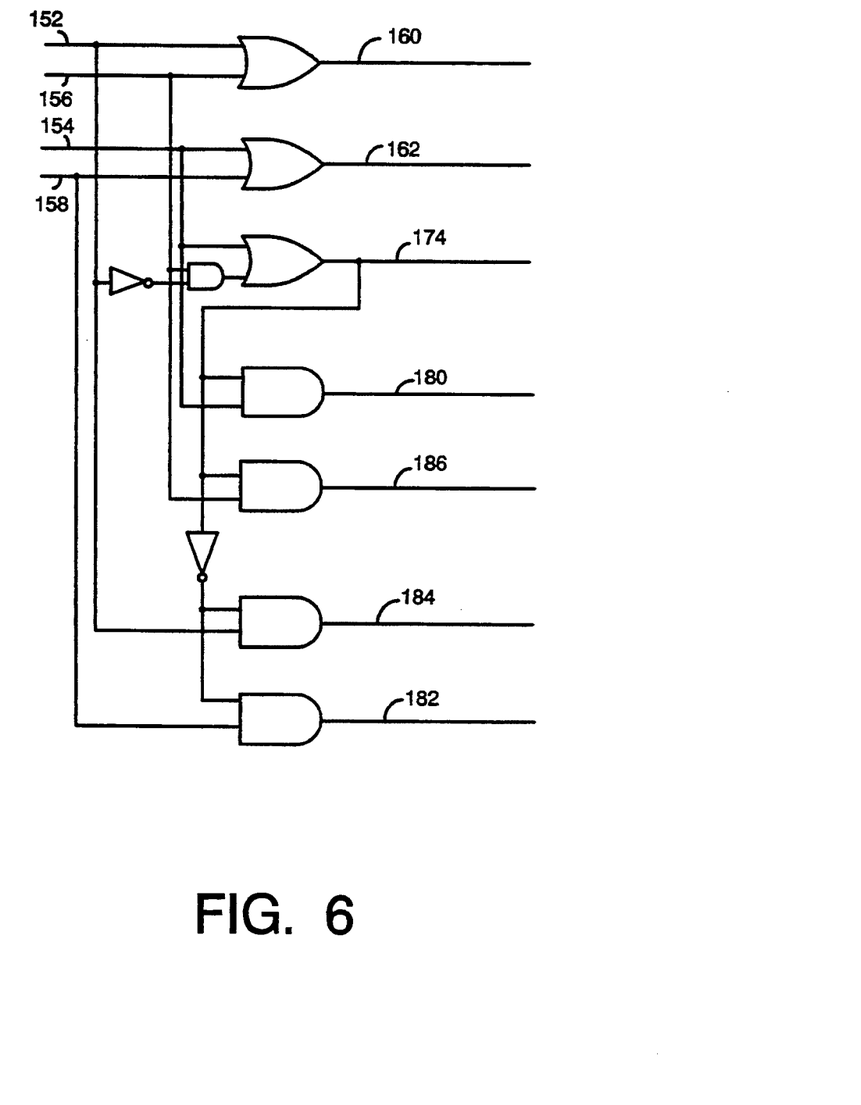
FIG. 6 is a logic diagram of a control device for the dual port memory.

The port 1 write request 152, the port 1 read request 154, the port 2 write request 156, and the port 2 read request 158 are input signals to the control device 138. Based on these inputs, the control device 138 generates the following signals: the write enable 160 and the read enable 162, which are connected to the random access memory 131; the address multiplexer select 174, which is connected to the multiplexer 140 and the multiplexer 142 for selecting the read and write addresses to send to the random access memory 131; and the latch enable 180, the latch enable 182, the latch enable 184, and the latch enable 186, which control the latch 170, the latch 172, the latch 164, and the latch 166, respectively. The multiplexer 168 which is also connected to multiplexer select 174 selects the data from either latch 164 or latch 166 to write into the random access memory 131. The logic of the control device 138 is shown in FIG. 6.

If the port 1 write request 152 and/or the port 2 write request 156 is high, then the write enable 160 is in a high state, which enables a write to the random access memory 131. If the port 1 read request 154 and/or the port 2 read request 158 is high, then the read enable 162 is in a high state, which enables a read from the random access memory 131.

In a high state the address multiplexer select 174 selects the port 1 address 144 and connects it to the read address 148 and also selects the port 2 address 146 and connects it to the write address 150. In a low state the address multiplexer select 174 selects the port 2 address 146 and connects it to the read address 148 and also selects the port 1 address 144 and connects it to the write address 150. The address multiplexer select 174 is in a high state if the port 1 read request 154 is high or if the port 2 write request 156 is high and the port 1 write request 152 is low. Otherwise, the address multiplexer select 174 is in a low state. The effect of this control logic in the control device 138 is that port 1 read or write always has priority over a read or write on port 2.

The latch enable 180 is high and enables latch 170, if the port 1 read request 154 is high and the address multiplexer select 174 is high, otherwise the latch enable 180 is low. The latch enable 182 is high and enables latch 172, if the port 2 read request 158 is high and the address multiplexer select 174 is low, otherwise the latch enable 182 is low. The latch enable 184 is high and enables latch 164, if the port 1 write request 152 is high and the address multiplexer select 174 is low, otherwise the latch enable 184 is low. The latch enable 186 is high and enables latch 166, if the port 2 write request 156 is a high and the address multiplexer select 174 is high, otherwise the latch enable 186 is low.

To read or write the memory, port 1 and/or 2 must request a read or write operation and be connected to the single read port or the single write port on the memory in order for the read or write operation to be executed. The two ports, port 1/port 2, can concurrently read/write or write/read the memory. The only restriction is that port 1 and port 2 cannot simultaneously read/read or write/write the memory during the same memory cycle.

To minimize the effect of the read/read and write/write restrictions, the following rules are obeyed. In the case of an attempt by port 1 and port 2 to read/read or write/write the memory, the port 1 request is executed and the port 2 request is ignored during that memory cycle. The second restriction is that port 1 may never issue two read or two write operations in consecutive memory cycles if either two read or two write operations are pending on both ports concurrently.

Thus, when a write/write request is pending, control 138 couples port 1 address 144 to write address 150 during the first cycle. During the second cycle, control 138 decouples Port 1 address 144 and couples Port 2 address 146 to write address 150. Note that in the case of a read/read request, control 138 couples port 1 address 144 to read address 148 during the first cycle and decouples port 1 address 144 and couples port 2 address 146 to read address 148 during the second cycle. Therefore, port 2 is guaranteed to have its request executed within two memory cycles at the most.

The following rules are applied to control access to the memory. If port 1 requests a read then it is connected to the read port of the memory and the read request is executed. If port 1 requests a write, then it is connected to the write port of the memory and the write request is executed. If port 1 is not requesting a read and port 2 requests a read, then port 2 is connected to the memory and the read request is executed. If port 1 is not requesting a write and port 2 requests a write, then port 2 is connected to the memory and the write request is executed.

If port 1 and 2 each requests a read operation then port 1 is connected to the read port of the memory during the first cycle. If the subsequent request from port 1 is another read request then port 1 is uncoupled to allow port 2 to be connected to the read port of the memory during the second cycle. If however, the subsequent request from port 1 is a write request, then port 1 is switched to the write port of the memory while port 2 is connected to the read port of the memory during the second cycle. Note that, the same logic applies for a write/write request.

The plural port memory system provides a dense and low cost memory system that does not require precharging a data line during a read operation and provides multiple interfaces to the memory that are each able to read and write the memory. The plural port memory system also provides for arbitrating between the plural ports for access to the memory.

Thus, the present invention has been described herein with reference to a particular embodiment for a particular application. Nonetheless, those having ordinary skill in the art and access to present teachings will recognize additional modifications, applications, and embodiments within the scope thereof. For example, the CMOS memory of the present invention may be replaced with other technologies without departing from the scope of the present invention.

It is therefore intended by the appended claims to cover any and all such applications, modifications and embodiments within the scope of the present invention.

What is claimed is:

1. A plural port memory system utilizing a memory having a write port and a separate read port wherein the write port includes a write data line, a write address, and a write enable line and wherein the read port includes a read data line, a read address, and a read enable line, the plural port memory system comprising:
    a plurality of interface means for reading from and writing to the memory, each interface having a read request line and a write request line; and
    control means coupled to each of the read request lines, each of the write request lines, and the read and write enable lines for arbitrating access to the memory by the plurality of interface means.

2. The plural port memory system of claim 1 wherein if at least two read requests are simultaneously received by the control means during a first cycle of the memory, the control means activates the read enable to the memory and selectively couples a first one of the interface means to the read port during the first cycle of the memory, and on a second cycle of the memory decouples the first one of the interface means, activates the read enable and selectively couples a second one of the interface means to the read port, and if at least two write requests are simultaneously received by the control means during a first cycle of the memory, the control means activates the write enable to the memory and selectively couples a first one of the interface means to the write port during the first cycle of the memory and on a fourth cycle of the memory decouples the first one of the interface means, activates the write enable and selectively couples the second one of the interface means to the write port.

3. The plural port memory system of claim 1 wherein each interface means has successive read requests separated by at least one cycle of the memory if two read requests are pending.

4. The plural port memory system of claim 3 wherein each interface means has successive write requests separated by at least one cycle of the memory if two write requests are pending.

5. The plural port memory system of claim 4 wherein each interface means further comprises:
    a data interface line selectively coupled to the read data line and selectively coupled to the write data line; and
    an interface address selectively coupled to the read address and selectively coupled to the write address.

6. The plural port memory system of claim 5 wherein the plurality of interface means further comprise:

first multiplexer means coupled to the control means, the read address, and each interface address for providing a switch responsive to the control means for selectively coupling the read address to one of the interface addresses; and second multiplexer means coupled to the control means, the write address, the each interface address for providing a switch responsive to the control means for selectively coupling the write address to one of the interface addresses;

wherein when the first multiplexer means couples a first one of the interface addresses to the read address then the second multiplexer means couples a second one of the interface addresses to the write address, and when the second multiplexer couples the first one of the interface addresses to the write address then the first multiplexer couples the second one of the interface addresses to the read address.

7. The plural port memory system of claim 6 wherein the plurality of interface means further comprise:

a plurality of write latch means each for retaining data for writing to the memory and each coupled to one of the data interface lines; and first multiplexer means for providing a switch responsive to the control means coupled to the plurality of latch means and to the write data line.

8. The plural port memory system of claim 7 wherein the plurality of interface means further comprise:

a plurality of read latch means each for retaining data read from the memory and each coupled to one of the data interface lines.

9. A dual port memory system utilizing a memory having a write port and a separate read port wherein the write port includes a write data line, a write address, and a write enable line and wherein the read port includes a read data line, a read address, and a read enable line, the dual port memory system comprising:

first interface means for reading from and writing to the memory having a first read request line and a first write request line; and second interface means for reading from and writing to the memory having a second read request line and a second write request line; and control means coupled to the first and second read request lines, the first and second write request lines, and the read and write enable lines for arbitrating access to the memory by the first and second interface means and if the first and second read requests are simultaneously received by the control means during a first cycle of the memory, the control means activates the read enable to the memory and selectively couples the first interface means to the read port during the first cycle of the memory, and on a second cycle of the memory decouples the first interface means, activates the read enable and selectively couples the second interface means to the read port, and if the first and second write requests are simultaneously received by the control means during a first cycle of the memory, the control means activates the write enable to the memory and selectively couples the first interface means to the write port and on a second cycle of the memory decouples the first interface means, activates the write enable and selectively couples the second interface means to the write port.

10. The dual port memory system of claim 9 wherein:

the first interface means has successive read requests separated by at least one cycle of the memory if two read requests are pending; and the second interface means has successive read requests separated by at least one cycle of the memory if two read requests are pending.

11. The dual port memory system of claim 10 wherein:

the first interface means has successive write requests separated by at least one cycle of the memory; and the second interface means has successive read requests separated by at least one cycle of the memory.

12. The dual port memory system of claim 11 wherein the first interface means further comprises:

a first data interface line selectively coupled to the read data line and selectively coupled to the write data line; and a first interface address selectively coupled to the read address and selectively coupled to the write address.

13. The dual port memory system of claim 12 wherein the second interface means further comprises:

a second data interface line selectively coupled to the read data line and selectively coupled to the write data line; and a second interface address selectively coupled to the read address and selectively coupled to the write address.

14. The dual port memory system of claim 13 further comprising:

first multiplexer means coupled to the control means, the read address, and the first and second interface addresses for providing a switch responsive to the control means for selectively coupling the read address to the first or the second interface addresses; and second multiplexer means coupled to the control means, the write address, and the first and second interface addresses for providing a switch responsive to the control means for selectively coupling the write address to the first or the second interface addresses;

wherein when the first multiplexer means couples the first interface address to the read address then the second multiplexer means couples the second interface address to the write address, and when the second multiplexer couples the first interface address to the write address then the first multiplexer couples the second interface address to the read address; and wherein when the first multiplexer means couples the second interface address to the read address then the second multiplexer means couples the first interface address to the write address, and when the second multiplexer couples the second interface address to the write address then the first multiplexer couples the first interface address to the read address.

15. The dual port memory system of claim 14 further comprising:

a first write latch means for retaining data for writing to the memory coupled to the first data interface line;

a second write latch means for retaining data for writing to the memory coupled to the second data interface line; and first multiplexer means for providing a switch responsive to the control means coupled to the first and second write latch means and to the write data line.

16. The dual port memory system of claim 15 further comprising:

a first read latch means for retaining data read from the memory and each coupled to the first data interface line; and a second read latch means for retaining data read from the memory and each coupled to the first data interface line.

* * * * *